United States Patent
Roh et al.

(10) Patent No.: US 10,181,525 B2
(45) Date of Patent: Jan. 15, 2019

(54) SEMICONDUCTOR DEVICES AND METHODS OF FORMING THE SAME

(71) Applicant: Samsung Electronics Co., Ltd., Suwon-si (KR)

(72) Inventors: Donghyun Roh, Suwon-si (KR); Pankwi Park, Incheon (KR); Dongsuk Shin, Yongin-si (KR); Chulwoong Lee, Suwon-si (KR); Nae-in Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/374,093

(22) Filed: Dec. 9, 2016

(65) Prior Publication Data
US 2017/0092769 A1     Mar. 30, 2017

Related U.S. Application Data

(63) Continuation of application No. 14/969,702, filed on Dec. 15, 2015, now Pat. No. 9,548,389, which is a
(Continued)

(30) Foreign Application Priority Data

Sep. 21, 2012    (KR) .................... 10-2012-0105406

(51) Int. Cl.
*H01L 29/78*     (2006.01)
*H01L 21/306*    (2006.01)
(Continued)

(52) U.S. Cl.
CPC .... *H01L 29/7849* (2013.01); *H01L 21/30604* (2013.01); *H01L 21/76224* (2013.01);
(Continued)

(58) Field of Classification Search
CPC combination set(s) only.
See application file for complete search history.

(56) References Cited

U.S. PATENT DOCUMENTS 6,214,679 B1 *  4/2001  Murthy ............. H01L 29/41783
                                                    257/E21.165
6,551,887 B2    4/2003  Kwon et al.
(Continued)

FOREIGN PATENT DOCUMENTS

JP      2011091265      5/2011
KR      100395878       8/2003
(Continued)

OTHER PUBLICATIONS

"Semiconductor Devices and Methods of Forming the Same" Specification, Drawings and Prosecution History, of U.S. Appl. No. 13/957,912, filed Aug. 2, 2013, by inventor Donghyun Roh, et al.
(Continued)

*Primary Examiner* — Telly Green
(74) *Attorney, Agent, or Firm* — Onello & Mello, LLP

(57) ABSTRACT

According to embodiments of the inventive concept, a gate electrode is formed on a substrate, and a first spacer, a second spacer, and a third spacer are sequentially formed on a sidewall of the gate electrode. The substrate is etched to form a recess region. A compressive stress pattern is formed in the recess region. A protective spacer is formed on a sidewall of the third spacer. When the recess region is formed, a lower portion of the second spacer is removed to form a gap region between the first and third spacers. The protective spacer fills the gap region.

26 Claims, 25 Drawing Sheets

Related U.S. Application Data continuation of application No. 13/957,912, filed on Aug. 2, 2013, now Pat. No. 9,252,235.

(51) Int. Cl.

| | | |
|---|---|---|
| *H01L 29/66* | (2006.01) | |
| *H01L 29/423* | (2006.01) | |
| *H01L 29/06* | (2006.01) | |
| *H01L 21/762* | (2006.01) | |
| *H01L 29/165* | (2006.01) | |
| *H01L 21/8234* | (2006.01) | |
| *H01L 29/161* | (2006.01) | |

(52) U.S. Cl.
CPC ........... *H01L 21/823412* (2013.01); *H01L 21/823418* (2013.01); *H01L 21/823468* (2013.01); *H01L 21/823481* (2013.01); *H01L 29/0649* (2013.01); *H01L 29/161* (2013.01); *H01L 29/165* (2013.01); *H01L 29/42376* (2013.01); *H01L 29/66477* (2013.01); *H01L 29/66553* (2013.01); *H01L 29/7848* (2013.01)

(56) References Cited

U.S. PATENT DOCUMENTS

| | | | |
|---|---|---|---|
| 7,022,596 B2 | 4/2006 | Zhoong et al. | |
| 7,498,640 B2 * | 3/2009 | Cabral, Jr. | ........ H01L 21/28052 |
| | | | 257/382 |
| 7,591,659 B2 | 9/2009 | Chen et al. | |
| 7,982,315 B2 | 7/2011 | Chen et al. | |
| 8,048,765 B2 | 11/2011 | Chen et al. | |
| 8,076,209 B2 | 12/2011 | Yang et al. | |
| 8,183,118 B2 | 5/2012 | Lu et al. | |
| 8,409,947 B2 | 4/2013 | Kim et al. | |
| 8,604,554 B2 | 12/2013 | Itou et al. | |
| 9,093,303 B2 * | 7/2015 | Lii | ........ H01L 27/092 |
| 9,799,766 B2 * | 10/2017 | Chen | ........ H01L 29/66681 |
| 2003/0045061 A1 | 3/2003 | Kwon et al. | |
| 2005/0282344 A1 | 12/2005 | Jin et al. | |
| 2008/0199998 A1 * | 8/2008 | Chen | ........ H01L 21/823412 |
| | | | 438/275 |
| 2010/0047985 A1 | 2/2010 | Murthy et al. | |
| 2010/0105184 A1 | 4/2010 | Fukuda et al. | |
| 2010/0197092 A1 | 8/2010 | Kim et al. | |
| 2012/0146154 A1 | 6/2012 | Itou et al. | |
| 2012/0223364 A1 * | 9/2012 | Chung | ........ H01L 21/823807 |
| | | | 257/192 |
| 2012/0241868 A1 * | 9/2012 | Tsai | ........ H01L 21/823807 |
| | | | 257/369 |
| 2013/0049126 A1 * | 2/2013 | Flachowsky | .... H01L 21/823807 |
| | | | 257/369 |
| 2013/0126949 A1 * | 5/2013 | Liao | ........ H01L 29/66636 |
| | | | 257/288 |
| 2013/0320550 A1 | 12/2013 | Kim | |

FOREIGN PATENT DOCUMENTS

| | | |
|---|---|---|
| KR | 1020050064655 | 6/2005 |
| KR | 1020090045496 | 5/2009 |
| KR | 20100088905 | 8/2010 |

OTHER PUBLICATIONS

"Semiconductor Devices and Methods of Forming the Same" Specification, Drawings and Prosecution History, of U.S. Appl No. 14/969,702, filed Dec. 15, 2015, by inventor Donghyun Roh, et al.

* cited by examiner

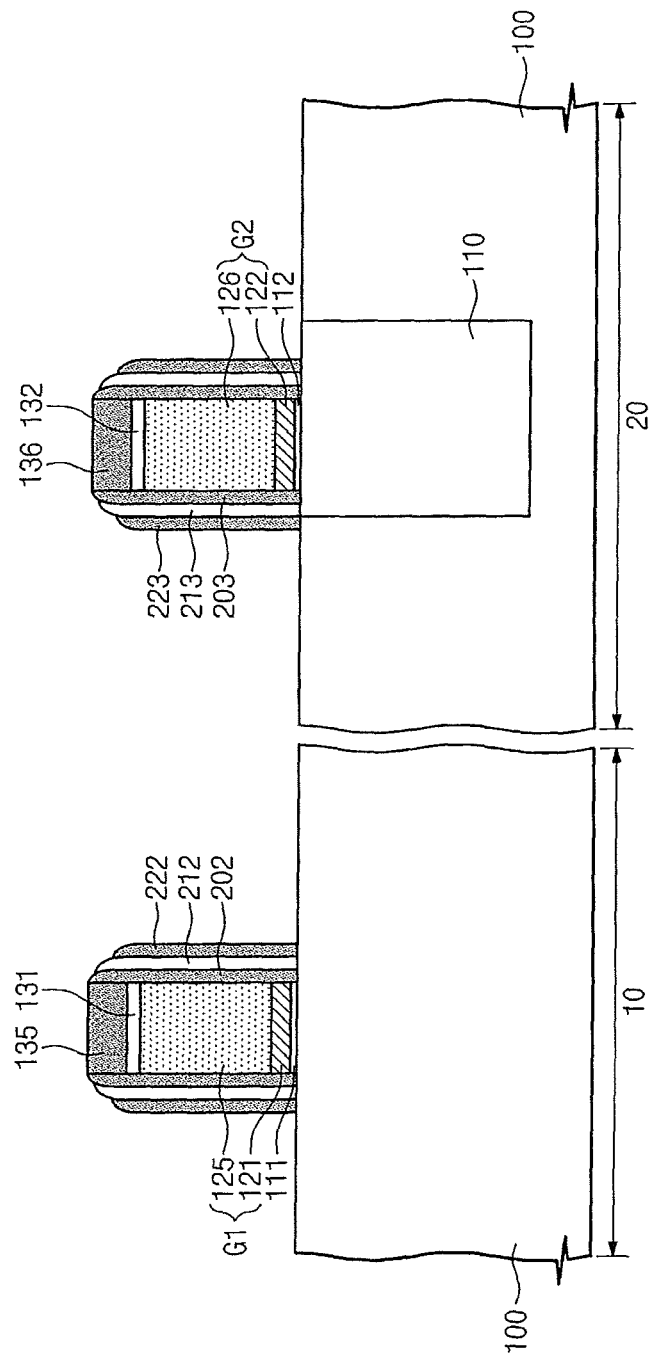

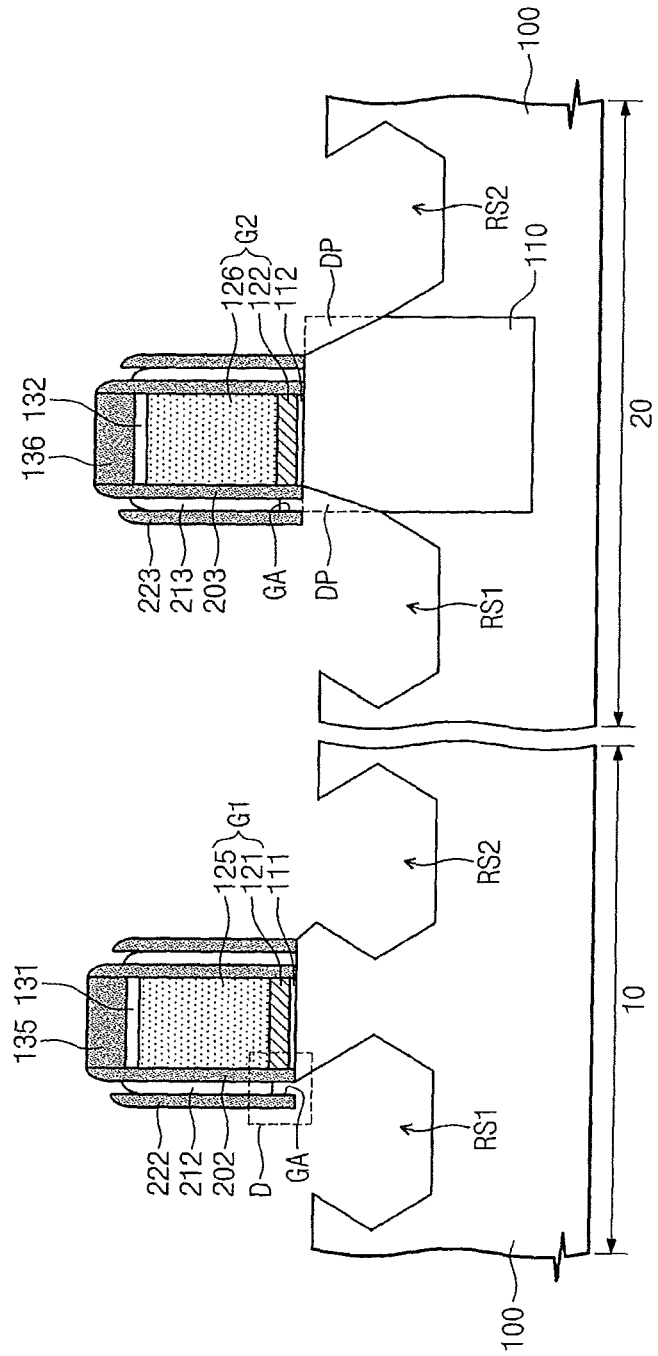

SEMICONDUCTOR DEVICES AND METHODS OF FORMING THE SAME

CROSS-REFERENCE TO RELATED APPLICATIONS

This application is a continuation application of U.S. patent application Ser. No. 14/969,702 filed Dec. 15, 2015, which is a continuation application of U.S. patent application Ser. No. 13/957,912 filed on Aug. 2, 2013, which claims the benefit of Korean patent application number 10-2012-0105406, filed on Sep. 21, 2012, in the Korean Intellectual Property Office, the contents of which applications are incorporated herein in their entirety by reference.

BACKGROUND

The inventive concept relates to semiconductor devices and methods of forming semiconductor devices.

Semiconductor devices are widely used in the electronics industry because of their small size, multi-functionality, and/or low manufacture costs. Accordingly, the development of semiconductor devices has been highly integrated with the development of the electronic industry. Widths and the spacing of patterns in semiconductor devices have been further and further reduced for higher integration of semiconductor devices. For recently targeted high levels of integration of semiconductor devices, however, new exposure techniques and/or very expensive exposure techniques are required, increasing the difficulty of achieving higher degrees of integration of the semiconductor devices. Thus, various research has been conducted for new integrating techniques.

SUMMARY

Embodiments of the inventive concept may provide semiconductor devices with improved reliability and methods of forming semiconductor devices with improved reliability.

Embodiments of the inventive concept may also include semiconductor devices capable of decreasing or preventing non-uniformity of threshold voltages of transistors and methods of forming the same.

In one aspect, a method of forming a semiconductor device may include: forming a gate electrode on a substrate; sequentially forming a first spacer, then a second spacer, and then a third spacer on a sidewall of the gate electrode; etching the substrate to form a recess region; forming a compressive stress pattern in the recess region; and forming a protective spacer on a sidewall of the third spacer. A lower portion of the second spacer may be removed during the formation of the recess region such that a gap region may be formed between the first spacer and the third spacer. The protective spacer may fill the gap region.

In some embodiments, the first spacer may be formed of the same material as the third spacer; and the protective spacer may be formed of a material having an etch selectivity with respect to the first and third spacers.

In some embodiments, the recess region may expose a bottom surface of the second spacer.

In some embodiments, forming the recess region may include removing a natural oxide layer formed in an inner surface of the recess region during etching the substrate. In this case, the lower portion of the second spacer may be removed together with the natural oxide layer.

In some embodiments, the method may further include performing a thermal treating process and/or a plasma treating process on the semiconductor device after forming the protective spacer.

In some embodiments, the method may further include forming a device isolation layer defining an active region of the substrate. A portion of the device isolation layer may be removed during the formation of the recess region such that a bottom surface of the second spacer may be exposed.

In some embodiments, the gate electrode may be formed on the device isolation layer.

In some embodiments, the protective spacer may be formed after the compressive stress pattern is formed.

In some embodiments, the method may further include forming a capping pattern on the gate electrode before forming the first spacer and removing the capping pattern after forming the compressive stress pattern. The capping pattern may be formed of the same material as the first and third spacers; and the third spacer may be prevented from being etched by the protective spacer when the capping pattern is removed.

In another aspect, a semiconductor device may include: a gate dielectric layer and a gate electrode provided on a top surface of a substrate, where the gate dielectric is positioned between the substrate and the gate electrode; an inner spacer and an outer spacer provided on a sidewall of the gate electrode, where the inner spacer is positioned between the gate-electrode sidewall and the outer spacer; and a compressive stress pattern provided in the substrate adjacent to the gate electrode. A top surface of the compressive stress pattern may be closer to a bottom surface of the substrate than is a bottom surface of the gate dielectric layer. A top surface of the inner spacer may be at a height from the substrate that is greater than half of the height that the gate electrode extends from the substrate and be closer to the substrate than is a top surface of the gate electrode. The outer spacer may extend between the inner spacer and the compressive stress pattern.

In some embodiments, the gate electrode may include a lower gate electrode on the gate dielectric layer and an upper gate electrode on the lower gate electrode; and the lower gate electrode may include a metal and/or a conductive metal nitride.

In some embodiments, the inner spacer may include: a first spacer, a second spacer, and a third spacer sequentially formed on the sidewall of the gate electrode, with first spacer positioned between the sidewall of the gate dielectric and the second spacer, and with the second spacer positioned between the first spacer and the third spacer; and a protecting pattern filling a gap region defined by a bottom surface of the second spacer and the sidewalls of the first and third spacers.

In some embodiments, the gap region may extend at least partially between the lower gate electrode and the substrate (i.e., in the orientations shown in the figures, the gap region may horizontally overlap with the lower gate electrode—likewise, other directional or orientational indications made here are in reference to the orientation shown in the figures).

In some embodiments, the second spacer and the protecting pattern may include a material having an etch selectivity with respect to the first and third spacers.

In some embodiments, the gate electrode may be provided on a device isolation layer defining an active region of the substrate; and the inner spacer may overlap with the compressive stress pattern along an axis normal to the bottom surface of the substrate (i.e., in the orientations shown in the figures, the inner spacer may vertically overlap with the compressive stress pattern).

In another aspect, a method of forming a semiconductor device includes the following: forming a gate electrode comprising at least one of a metal, a conductive metal nitride, and doped semiconductor material on a substrate comprising silicon, wherein the gate electrode includes at least one sidewall; sequentially forming a first spacer, then a second spacer, and then a third spacer on the sidewall of the gate electrode, wherein the first and third spacers comprise silicon nitride, wherein the second spacer comprises a silicon oxide and includes a lower portion, and wherein each spacer includes at least one sidewall; etching the substrate to form a recess region, wherein the lower portion of the second spacer is removed during the formation of the recess region such that a gap region is formed between the first spacer and the third spacer; performing a selective epitaxial growth process in the recess to form a compressive stress pattern in the recess region; and forming a protective spacer on the sidewall of the third spacer and filling the gap region with the protective spacer, wherein the protective spacer comprises at least one of a silicon oxide and silicon nitride.

In some embodiments, the compressive stress pattern may be doped with p-type dopant.

In some embodiments, the compressive stress patterns may comprise crystalline silicon-germanium.

In some embodiments, the etching of the substrate to form the recess region may include the following steps: selectively etching portions of the substrate to form preliminary recess regions on opposite sides of the gate electrode, wherein inner surfaces of the preliminary recess regions react with oxygen to form a first natural oxide layer; removing the first natural oxide layer via etching; then further etching the preliminary recess regions to form the recess regions, wherein inner surfaces of the recess regions react with oxygen to form a second natural oxide layer; removing the second natural oxide layer via etching, wherein a lower portion of the second spacer proximate the substrate is removed when the second natural oxide layer is removed.

In some embodiments, a top surface of the gate electrode, remote from the substrate, may be covered with a lower capping pattern comprising a silicon oxide; and the lower capping pattern may be covered with an upper capping pattern comprising silicon nitride.

BRIEF DESCRIPTION OF THE DRAWINGS

The inventive concept will become more apparent in view of the attached drawings and accompanying detailed description.

FIGS. 1A, 1B, 2A, 2B, 3A, 3B, 4A, 4B, 5A, 6, 7A, 7B, 8A, 8B, 9A, 9B, 10A, 10B, 11A and 11B are cross-sectional views illustrating a semiconductor device and a method of forming the same according to some embodiments of the inventive concept;

DETAILED DESCRIPTION OF EXEMPLARY EMBODIMENTS

Figure 1A:
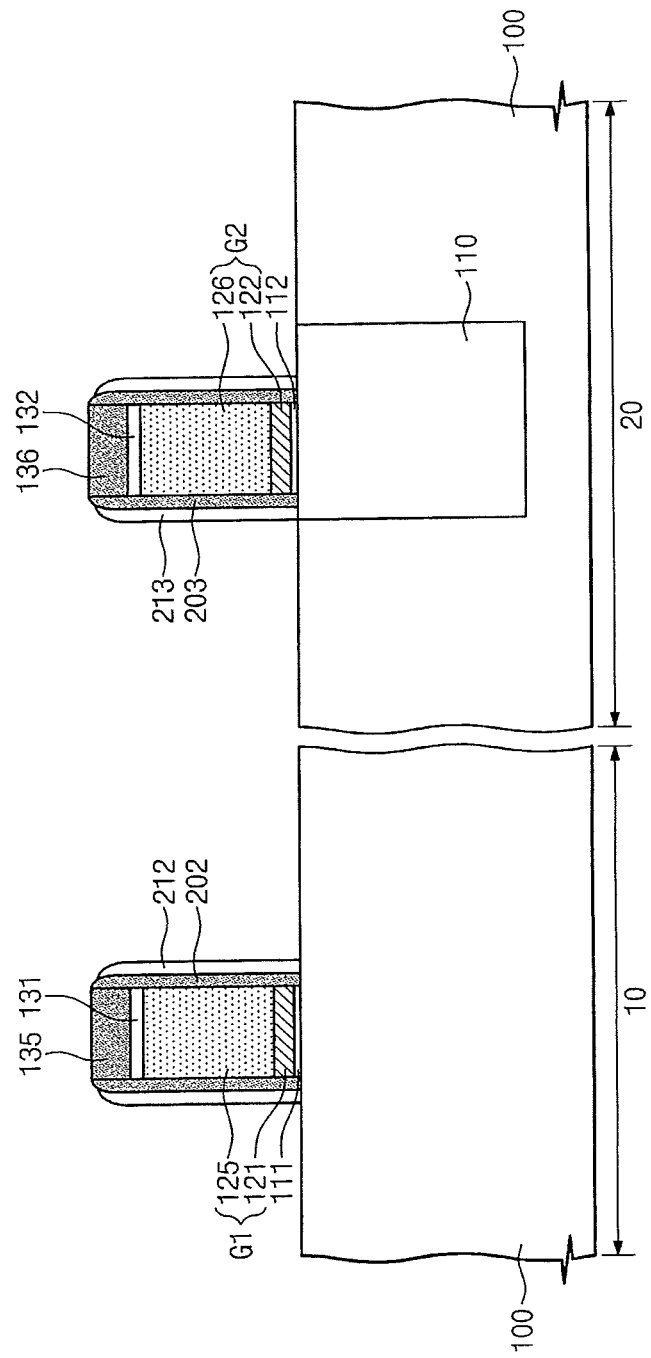

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and to let those skilled in the art know the category of the inventive concept. In the drawings, embodiments of the inventive concept are not limited to the specific examples provided herein, and features in the illustrations may be exaggerated for clarity.

The terminology used herein is for the purpose of describing particular embodiments and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element, such as a layer, region or substrate, is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will also be understood that although the terms first, second, third, etc., may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as being limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes do not necessarily illustrate the actual shape of a region of a device and are not intended to limit the scope of example embodiments.

FIGS. 1A to 11A and 1B to 11B are cross-sectional views illustrating a semiconductor device and a method of forming the same according to some embodiments of the inventive concept. FIGS. 1A to 11A are cross-sectional views of a first region 10 and a second region 20 of a substrate. FIGS. 1B to 11B are cross-sectional views of a third region 30 of the substrate. FIG. 5C is an enlarged view of a portion 'D' of FIG. 5A, and FIG. 9C is an enlarged view of a portion 'F' of FIG. 9A.

Figure 1B:
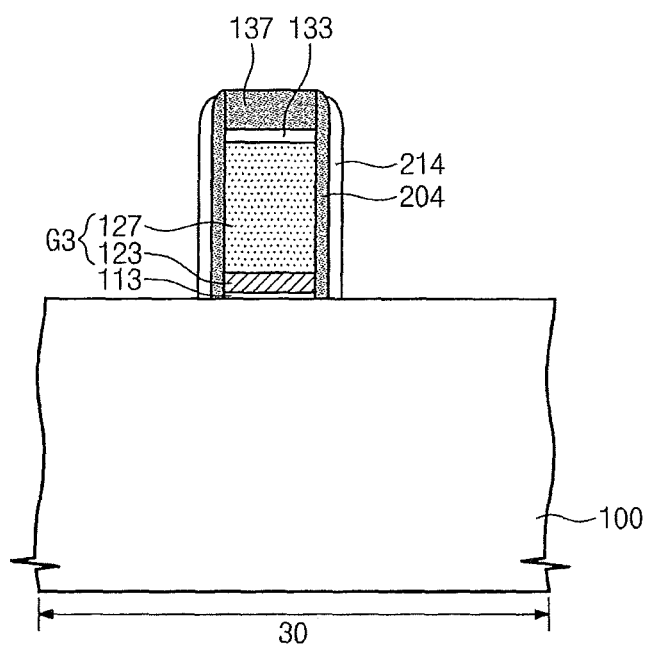

Referring to FIGS. 1A and 1B, a substrate 100 including the first, second, and third regions 10, 20, and 30 may be provided. The substrate 100 may include a semiconductor-based structure. For example, the substrate 100 may be a silicon substrate or a silicon-on-insulator (SOI) substrate. In some embodiments, the first region 10 and the second region 20 may be p-channel metal-on-semiconductor (PMOS) regions of a semiconductor device in which PMOS transistors are respectively formed. The third region 30 may be an n-channel metal-on-semiconductor (NMOS) region of the semiconductor device in which an NMOS transistor is formed. The substrate 100 of the first and second regions 10 and 20 may be doped with n-type dopants, and the substrate 100 of the third region 30 may be doped with p-type dopants.

A gate dielectric layer, a gate electrode layer, a lower capping layer, and an upper capping layer may be sequentially formed on the substrate 100 and then may be patterned to form gate structures on the first, second, and third regions 10, 20, and 30, respectively. The gate structure on the first region 10 may include a first gate dielectric pattern 111, a first gate electrode pattern G1, a first lower capping pattern 131, and a first upper capping pattern 135, which are sequentially stacked. The gate structure on the second region 20 may include a second gate dielectric pattern 112, a second gate electrode pattern G2, a second lower capping pattern 132, and a second upper capping pattern 136, which are sequentially stacked. The gate structure on the third region 30 may include a third gate dielectric pattern 113, a third gate electrode pattern G3, a third lower capping pattern 133, and a third upper capping pattern 137, which are sequentially stacked.

The first to third gate electrodes G1, G2, and G3 may be formed on the substrate 100 of the first to third regions 10, 20, and 30, respectively. The first gate electrode pattern G1 may be formed on an active region defined in the first region 10, and the third gate electrode pattern G3 may be formed on an active region defined in the third region 30. The active region of the first region 10 and the active region of the third region 30 may correspond to a portion of the substrate 100 of the first region 10 and a portion of the substrate 100 of the third region 30, respectively. The second gate electrode pattern G2 may be formed on a device isolation layer 110 formed in the substrate 100 of the second region 20 and may define an active region in the second region 20. In other words, the first gate dielectric pattern 111 may be disposed between the first gate electrode pattern G1 and the substrate 100, and the third gate dielectric pattern 113 may be disposed between the third gate electrode pattern G3 and the substrate 100. The second gate dielectric pattern 112 may be disposed between the second gate electrode pattern G2 and the device isolation layer 110. For example, the device isolation layer 110 may include a silicon oxide (e.g., $SiO_2$) and/or a silicon oxynitride layer. The first to third lower capping patterns 131, 132, and 133 may be formed on the first to third gate electrodes patterns G1, G2, and G3, respectively. The first to third upper capping patterns 135, 136, and 137 may be formed on the first to third lower capping patterns 131, 132, and 133, respectively.

The first to third gate dielectric patterns 111, 112, and 113 may include a high-k dielectric material having a dielectric constant greater than that of silicon oxide. For example, the first to third gate dielectric patterns 111, 112, and 113 may include at least one of hafnium oxide ($HfO_2$), aluminum oxide ($Al_2O_3$), or tantalum oxide ($Ta_2O_5$). In other embodiments, the first to third gate dielectric patterns 111, 112, and 113 may include at least one of silicon oxide, silicon oxynitride, or silicon nitride. In some embodiments, the first to third gate dielectric patterns 111, 112, and 113 may be formed by at least one of a chemical vapor deposition (CVD) process, an atomic layer deposition (ALD) process, or a thermal oxidation process.

The first to third gate electrode patterns G1, G2, and G3 may include lower gate electrodes 121, 122, and 123 and upper gate electrodes 125, 126, and 127 on the lower gate electrodes 121, 122, and 123. In some embodiments, the upper gate electrodes 125, 126, and 127 may be thicker than the lower gate electrodes 121, 122, and 123. The lower gate electrodes 121, 122, and 123 may include a metal and/or a conductive metal nitride. For example, the lower gate electrodes 121, 122, and 123 may include titanium nitride (TiN), tantalum nitride (TaN), or tungsten nitride ($W_xN_y$). In some embodiments, the upper gate electrodes 125, 126, and 127 may include a doped semiconductor material, such as doped silicon, doped silicon-germanium, or doped germanium. For example, the upper gate electrodes 125, 126, and 127 may include doped poly-silicon or doped amorphous silicon. The first to third gate electrode patterns G1, G2, and G3 may be formed using at least one of a CVD process, an ALD process, or a sputtering process.

The upper capping patterns 135, 136, and 137 may be formed of a material having an etch selectivity with respect to the lower capping patterns 131, 132, and 133 (i.e., the upper capping patterns are etched at a higher rate than the lower capping patters). For example, the lower capping patterns 131, 132, and 133 may include a silicon oxide, and the upper capping patterns 135, 136, and 137 may include silicon nitride. The upper capping patterns 135, 136, and 137 may be thicker than the lower capping patterns 131, 132, and 133; and the lower capping patterns 131, 132, and 133 and the upper capping patterns 135, 136, and 137 may be formed using CVD processes.

First spacers 202, 203, and 204 may be formed on sidewalls of the first to third gate electrode patterns G1, G2, and G3, respectively. A first insulating layer may be formed to cover the substrate 100; and then the first insulating layer may be anisotropically etched to form the first spacers 202, 203, and 204. The first insulating layer may be etched by an anisotropic dry etching process. Second spacers 212, 213, and 214 may be formed on sidewalls of the first spacers 202, 203, and 204, respectively. A second insulating layer may be formed to cover the first spacers 202, 203, and 204; and then the second insulating layer may be anisotropically etched by an anisotropic dry etching process to form the second spacers 212, 213, and 214. The first spacers 202, 203, and 204 may be formed of a material having an etch selectivity with respect to the second spacers 212, 213, and 214. In some embodiments, the first spacers 202, 203, and 204 may be formed of the same material as the upper capping patterns 135, 136, and 137; and the second spacers 212, 213, and 214 may be formed of the same material as the lower capping patterns 131, 132, 133. For example, the first spacers 202, 203, and 204 may include silicon nitride, and the second spacers 212, 213, and 214 may include a silicon oxide.

Figure 2B:
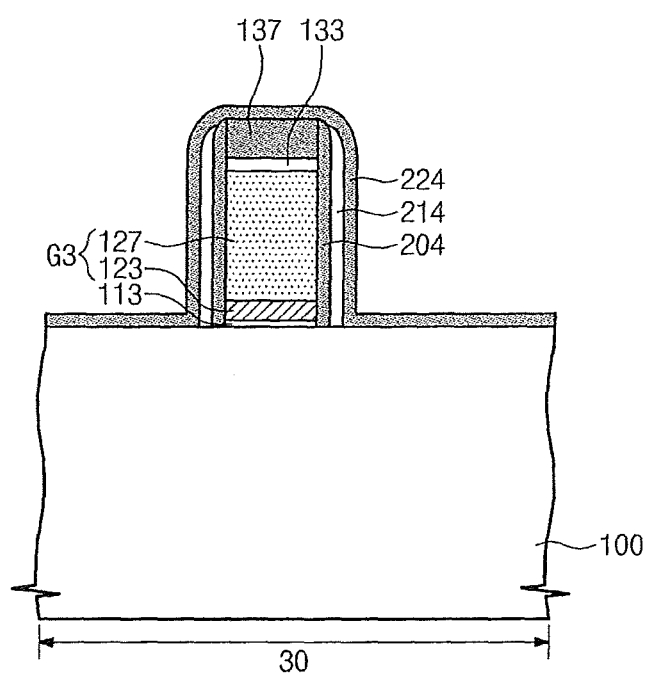

Referring to FIGS. 2A and 2B, third spacers 222 and 223 may be formed on sidewalls of the second spacers 212 and 213 of the first and second regions 10 and 20, respectively; and a masking insulating layer 224 may be formed on the substrate 100 of the third region 30. A third insulating layer may be formed on the substrate 100 having the second spacers 212, 213, and 214; and then a mask layer (not illustrated) may be formed to cover the third insulating layer of the third region 30. At this time, the third insulating layer of the first and second regions 10 and 20 may be exposed. The third insulating layer may be anisotropically etched using the mask layer (not illustrated) as an etch mask to form the third spacers 222 and 223 and the masking insulating layer 224. The masking insulating layer 224 may correspond to the third insulating layer of the third region 30 covered by the mask layer (not illustrated). Subsequently, the mask layer (not illustrated) may be removed. In some embodiments, the third spacers 222 and 223 and the masking insulating layer 224 may be formed of an insulating material having an etch selectivity with respect to the second spacers 212, 213, and 214. For example, the third spacers 222 and 223 and the masking insulating layer 224 may be formed of the same material as the first spacers 202, 203, and 204.

Figure 3A:
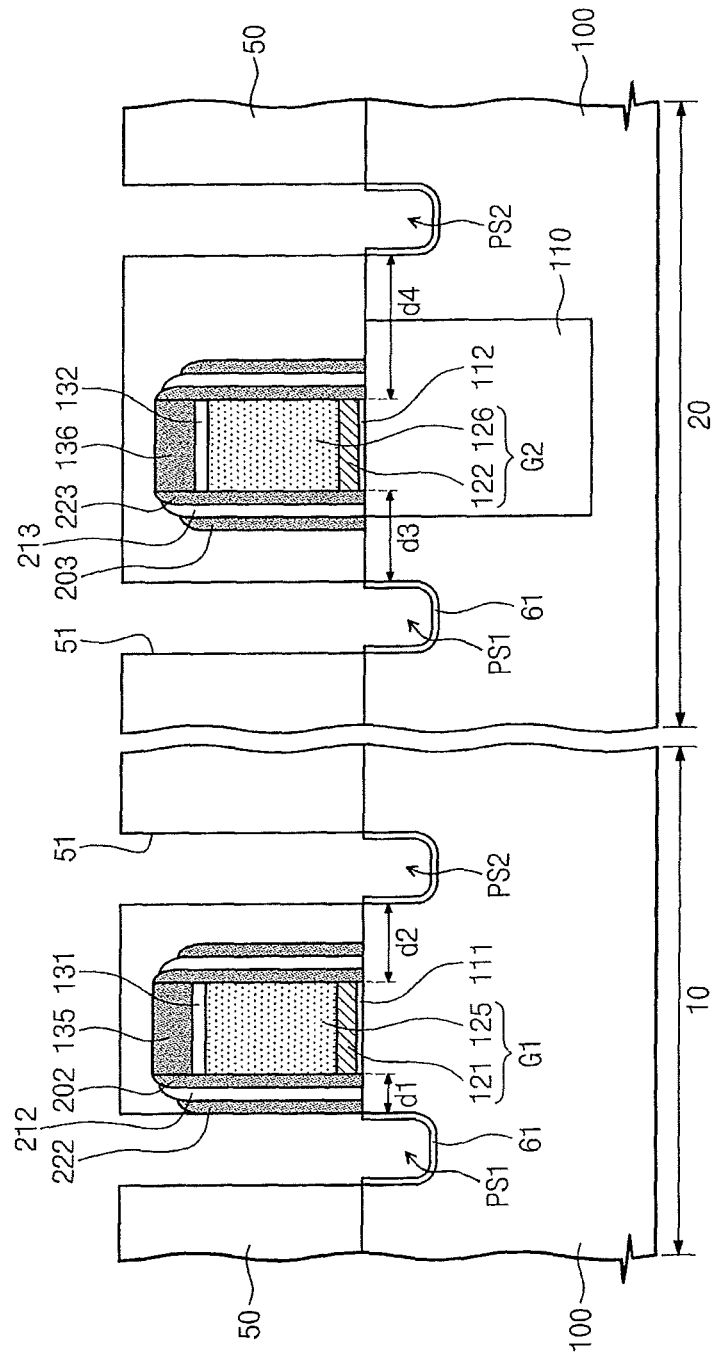
Figure 3B:
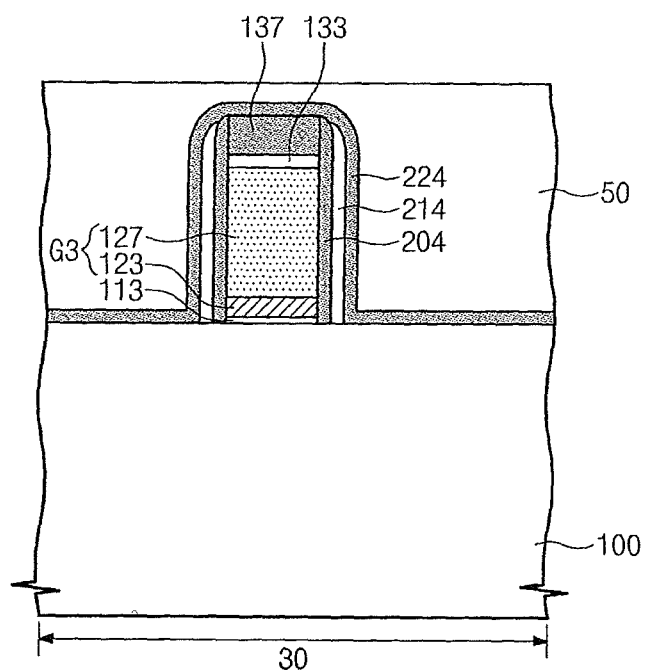

Referring to FIGS. 3A and 3B, a mask pattern 50 may be formed on the substrate 100. The mask pattern 50 may include openings 51 respectively exposing portions of the substrate 100 in the first and second regions 10 and 20. The openings 51 may be formed at both sides of each of the first and second gate electrode patterns G1 and G2, respectively. The openings 51 may not be provided in the mask pattern 50 of the third region 30. For example, the mask pattern 50 may include at least one of silicon nitride or silicon oxynitride.

The substrate 100 exposed by the openings 51 may be etched using the mask pattern 50 as an etch mask to form first and second preliminary recess regions PS1 and PS2 in an upper portion of the substrate 100. In some embodiments, the etching process for the formation of the preliminary recess regions PS1 and PS2 may include a dry etching process. Distances d1 and d3 between the first preliminary recess regions PS1 and the first and second gate electrode patterns G1 and G2 may be less than distances d2 and d4 between the second preliminary recess regions PS2 and the first and second gate electrode patterns G1 and G2. In some embodiments, horizontal distances between the second preliminary recess regions PS2 and the first and second gate electrode patterns G1 and G2 may be equal to or less than about 30 nm. Deference between the distances may be caused by misalignment of the openings 51. Alternatively, a first distance d1 may be substantially equal to a second distance d2, and a third distance d3 may be substantially equal to a fourth distance d4. In this case, gap region, described below, may be formed at both sides of each of the first and second gate electrode patterns G1 and G2, respectively. For the purpose of ease and convenience in explanation, an example is described hereinafter where the second distance d2 is greater than the first distance d1 and where the fourth distance d4 is greater than the third distance d3. However, the inventive concept is not limited thereto.

During the etching process, inner surfaces of the exposed preliminary recess regions PS1 and PS2 may react with oxygen to form a first natural oxide layer 61.

Figure 4A:
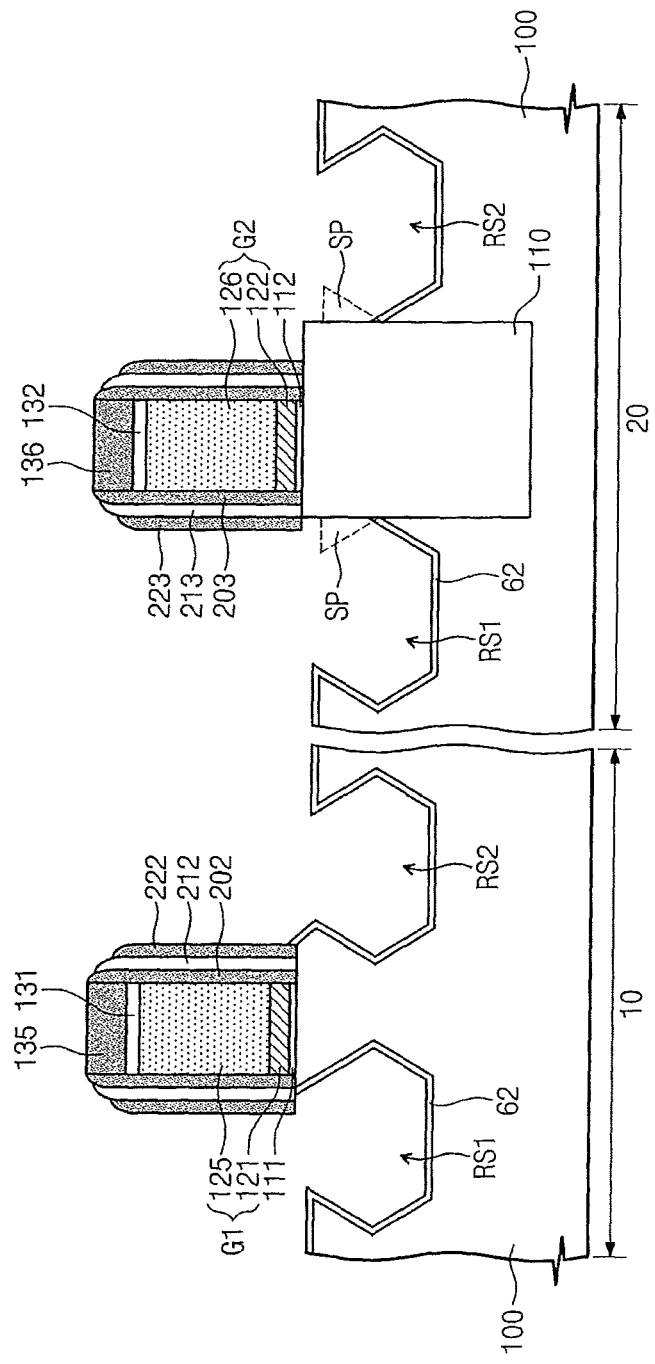
Figure 4B:
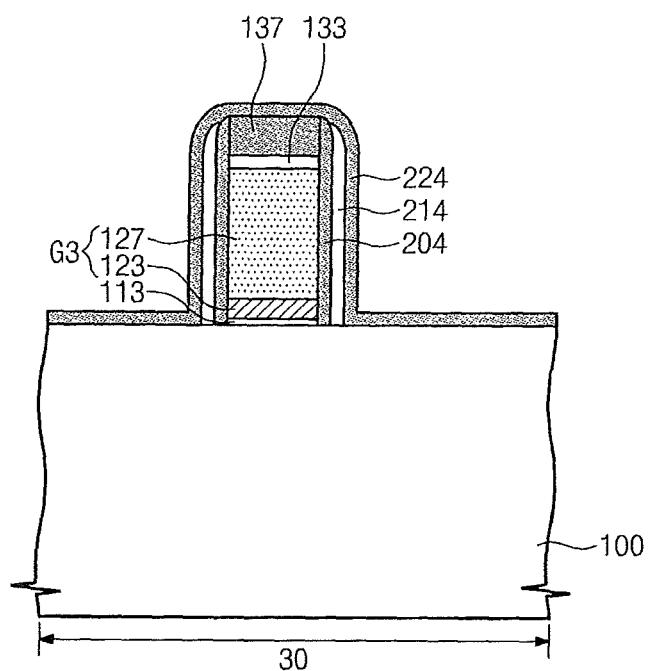

Referring to FIGS. 3A and 4A, the first natural oxide layer 61 may be removed. In some embodiments, the first natural oxide layer 61 may be removed using an etching material that includes $NF_3$ and/or $NH_3$. After the mask pattern 50 is removed (see FIGS. 3B and 4B), the preliminary recess regions PS1 and PS2 may be further etched to form recess regions RS1 and RS2. In some embodiments, the recess regions RS1 and RS2 may be formed by a wet etching process. In this case, an exposed top surface of the substrate 100 may also be etched. The substrate 100 of the third region 30 may be protected from the etching process for the formation of the recess regions RS1 and RS2 by the masking insulating layer 224.

The etching process for the formation of the recess regions RS1 and RS2 may be an anisotropic wet etching process. The anisotropic wet etching process may use crystal planes of the substrate 100 as etch stop planes. In some embodiments, the anisotropic wet etching process may use {111} crystal planes of the substrate 100 as the etch stop planes. Thus, the recess regions RS1 and RS2 may be tapered toward regions under the first and second gate electrode patterns G1 and G2 in a cross-sectional view.

If the substrate 100 is the silicon substrate, the anisotropic wet etching process may use an anisotropic etching solution including ammonia and/or tetramethyl ammonium hydroxide (TMAH).

Alternatively, the recess regions RS1 and RS2 may be formed by an anisotropic dry etching process using an etching gas having a straight etching property in a specific direction. For example, the anisotropic dry etching process may use an etching gas having the straight etching property in a direction making an acute angle with a perpendicular direction to the top surface of the substrate 100. In this case, the upper capping patterns 135 and 136 and the spacers 202, 203, 212, 213, 222, and 223 and the device isolation layer 110 may be used as etch masks.

First and second recess regions RS1 and RS2 in the second region 20 may expose sidewalls of the device isolation layer 110, respectively. When the first and second recess regions RS1 and RS2 are formed, a portion SP of the substrate 100 existing on the sidewall of the device isolation layer 110 may be separated from the substrate 100 to be removed. Exposed inner surfaces of the recess regions RS1 and RS2 may react with oxygen to form a second natural oxide layer 62 during the etching process for the formation of the recess regions RS1 and RS2.

Figure 5B:
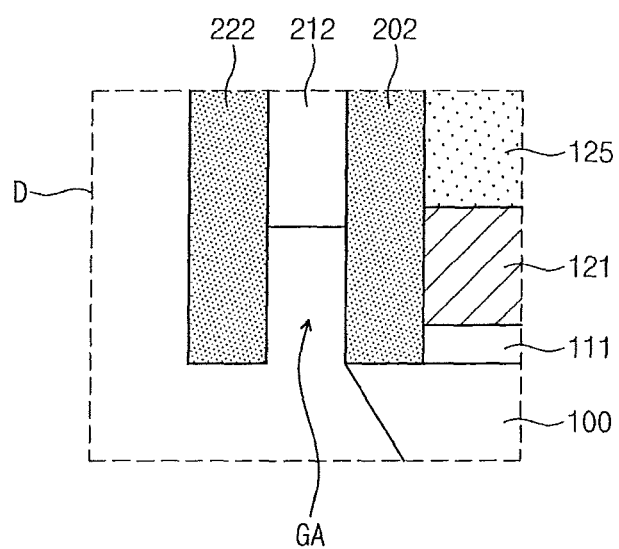
FIG. 5B is an enlarged view of a portion 'D' of FIG. 5A.

Referring to FIGS. 4A, 5A, and 5B, the second natural oxide layer 62 may be removed. For example, the second natural oxide layer 62 may be removed by an etching material including $NF_3$ and/or $NH_3$. Upper portions of the second spacers 212 and 213 may be etched when the second natural oxide layer 62 is removed. The third region 30 may be protected by the masking insulating layer 224 during the removal of the second natural oxide layer 62.

Lower portions of the second spacers 212 and 213 may be removed when the second natural oxide layer 62 is removed. Thus, a gap region GA may be formed between each of the first spacers 202 and 203 and each of the third spacers 222 and 223. The gap regions GA may be defined by sidewalls of the first spacers 202 and 203, sidewalls of the third spacers 222 and 223 and etched bottom surfaces of the second spacers 212 and 213. In some embodiments, the gap regions GA may be formed under the second spacers 212 and 213 adjacent to the first recess regions RS1, but may not be formed under the second spacers 212 and 213 adjacent to the second recess regions RS2.

The gap region GA may be formed if the first recess region RS1 is relatively closer to the first gate electrode pattern G1 as illustrated in the first region 10 of FIG. 5A. Compressive stress patterns, described below, may be provided in the recess regions RS1 and RS2. As the compressive stress patterns are more tapered toward the region under the first gate electrode G1, mobility of carriers in a channel may increase. As a result, the recess regions RS1 and RS2 may expose the second spacers 212; and then the lower portions of the second spacers 212 may be removed during the removal of the second natural oxide layer 62.

The gap regions GA may be formed if the first recess region RS1 is relatively closer to the second gate electrode pattern G2 on the device isolation layer 110 as illustrated in the second region 20 of FIG. 5A. If the device isolation layer 110 includes a silicon oxide, a portion DP of the device isolation layer 110 may also be removed during the removal of the second natural oxide layer 62. Thus, the lower portion of the second spacer 213 may be exposed and then etched.

Figure 6:
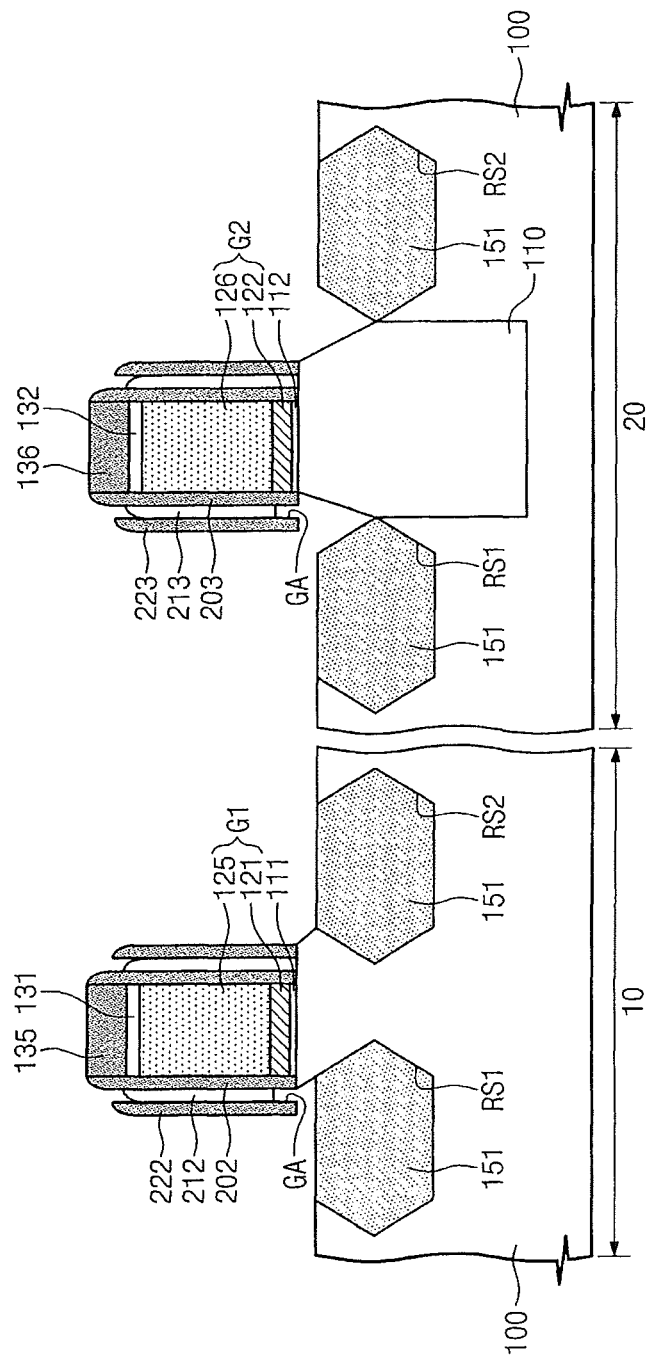

Referring to FIG. 6, the compressive stress patterns 151 may be formed in the recess regions RS1 and RS2. The compressive stress patterns 151 may be formed by a selective epitaxial growth (SEG) process performed in the recess regions RS1 and RS2. The masking insulating layer 224 may cover the substrate 100 of the third region 30 so that the compressive stress patterns 151 may not be formed in the third region 30. If the substrate 100 is formed of silicon, the compressive stress patterns 151 may include silicon-germanium. The compressive stress patterns 151 may have a crystalline state. In some embodiments, the compressive stress patterns 151 may have a substantially single-crystal state.

The compressive stress patterns 151 may be doped with p-type dopants by an in-situ method. Alternatively, the compressive stress patterns 151 may be doped with p-type dopants by an ion implantation method in a subsequent process. The compressive stress patterns 151 may increase the mobility of carriers in a channel region of the semiconductor device.

Figure 7A:
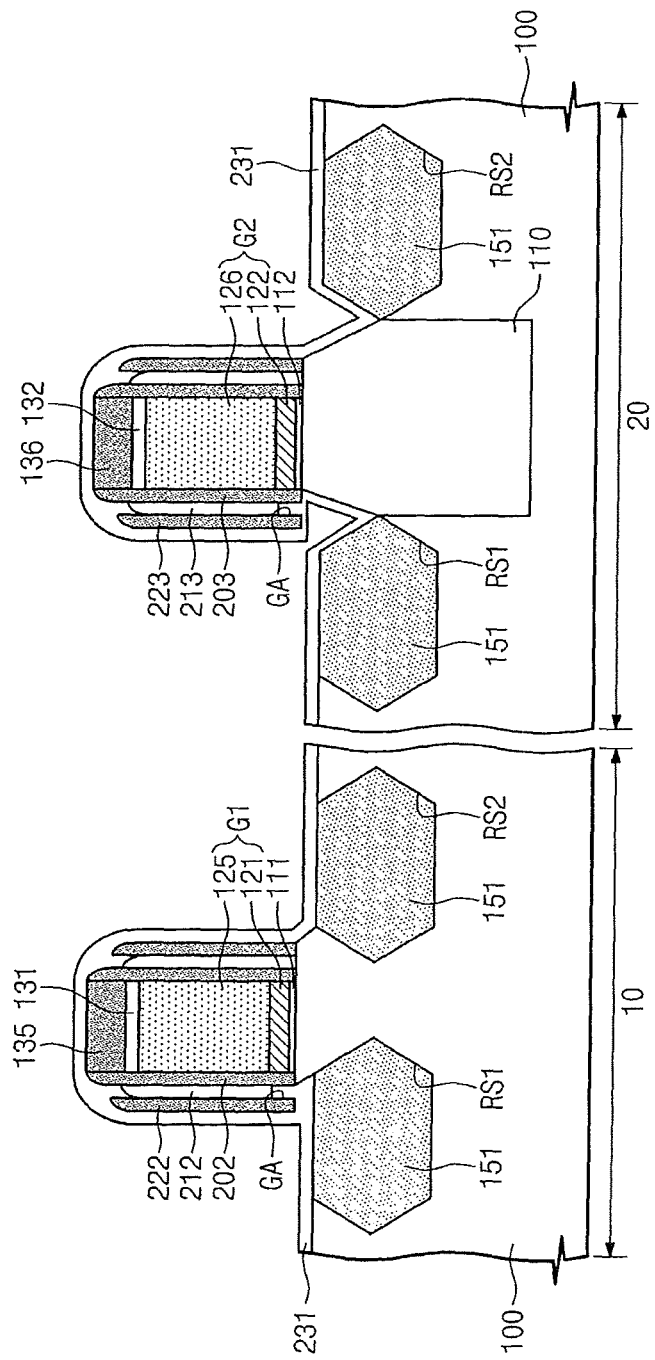
Figure 7B:
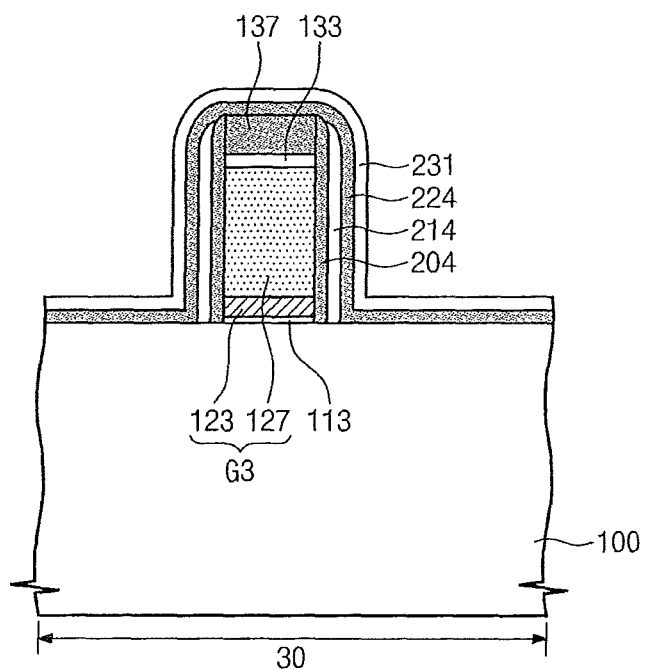

Referring to FIGS. 7A and 7B, a protecting insulating layer 231 may be formed on the substrate 100 including the compressive stress patterns 151. The protecting insulating layer 231 may fill the gap regions GA. In some embodiments, the protecting insulating layer 231 may include a silicon oxide layer or a silicon nitride layer. In another embodiment, the protecting insulating layer 231 may be a multi-layer including a silicon oxide layer and a silicon nitride layer.

Figure 8A:
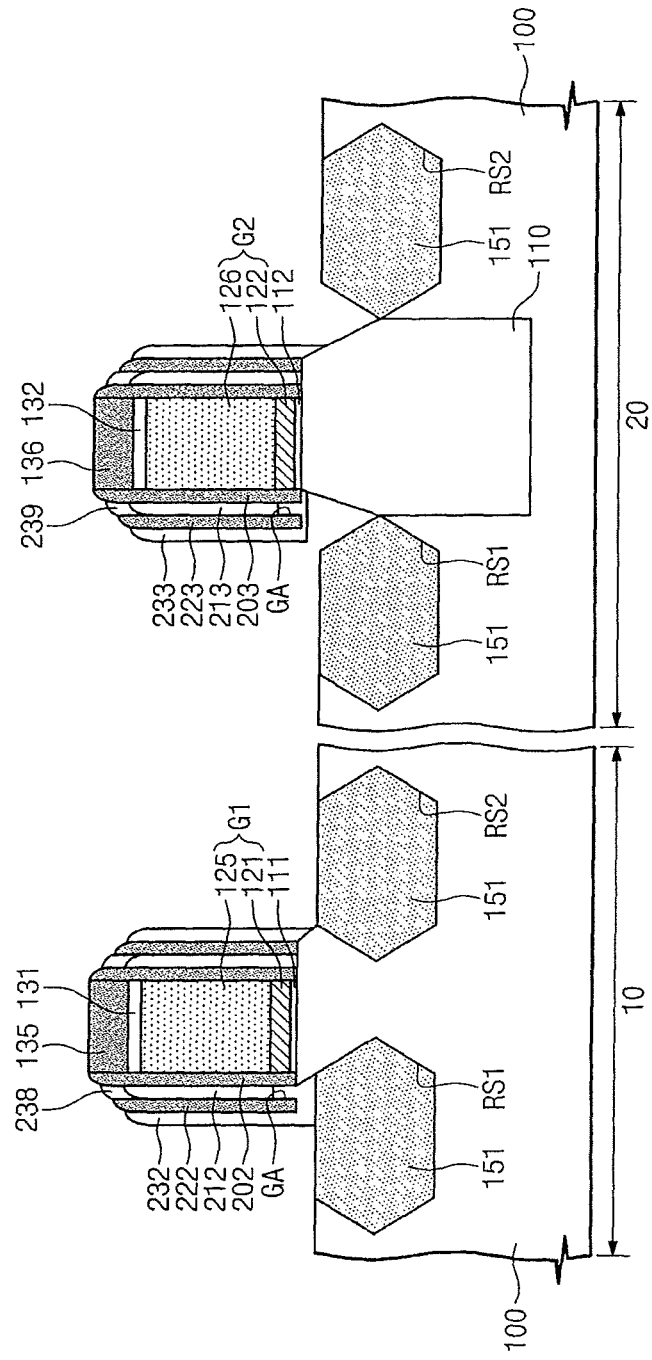
Figure 8B:
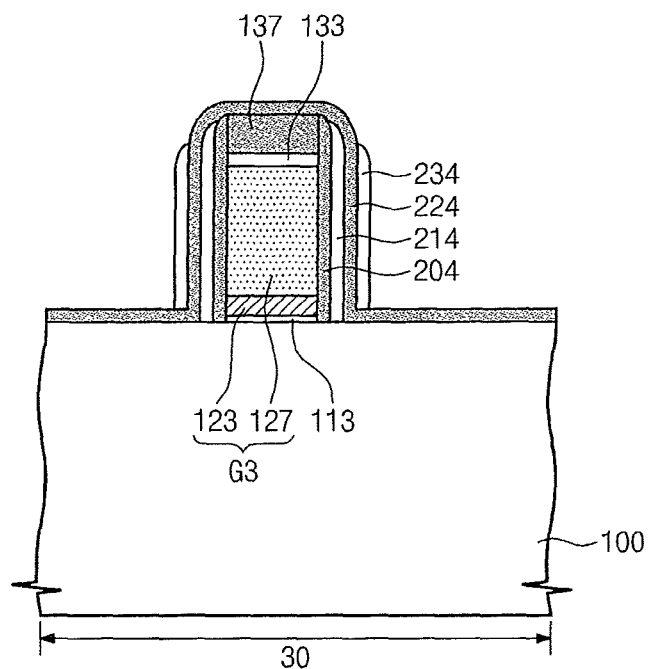
Figure 9A:
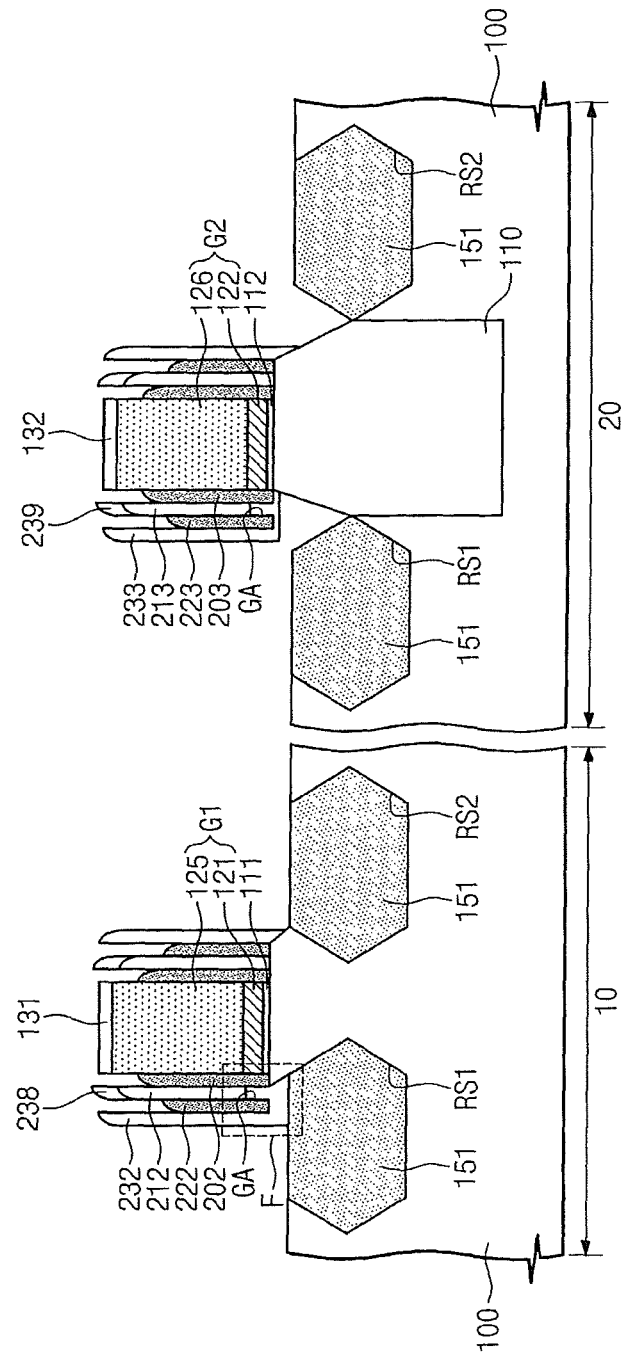
Figure 9B:
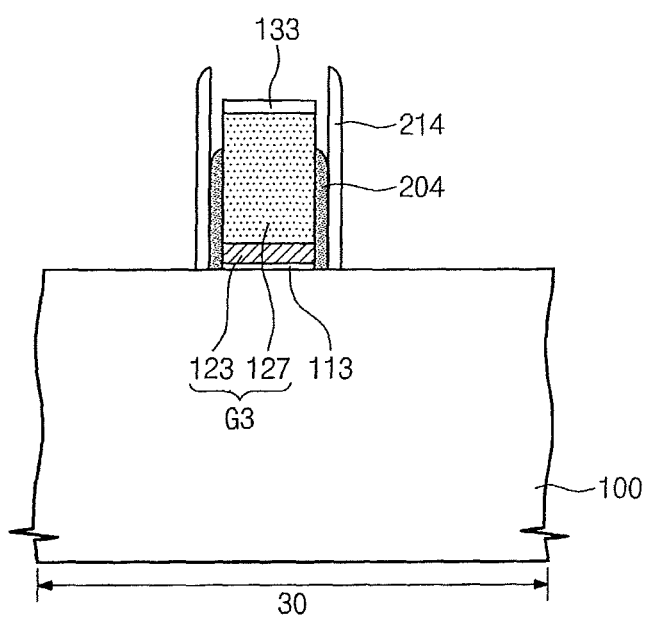
Figure 9C:
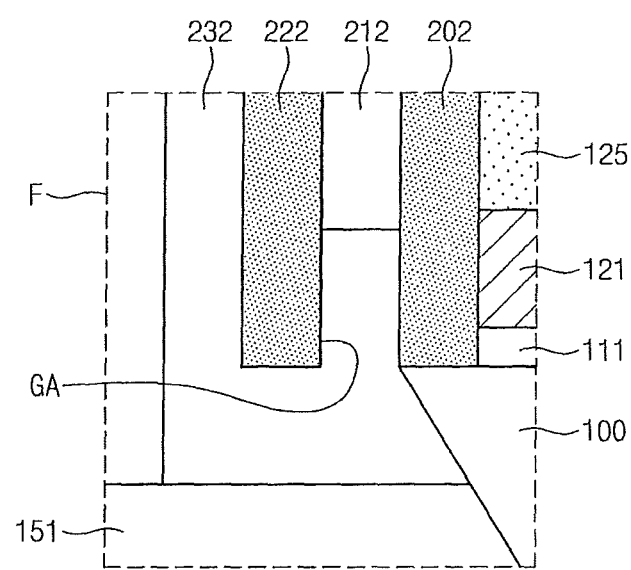
FIG. 9C is an enlarged view of a portion 'F' of FIG. 9A.
Figure 10A:
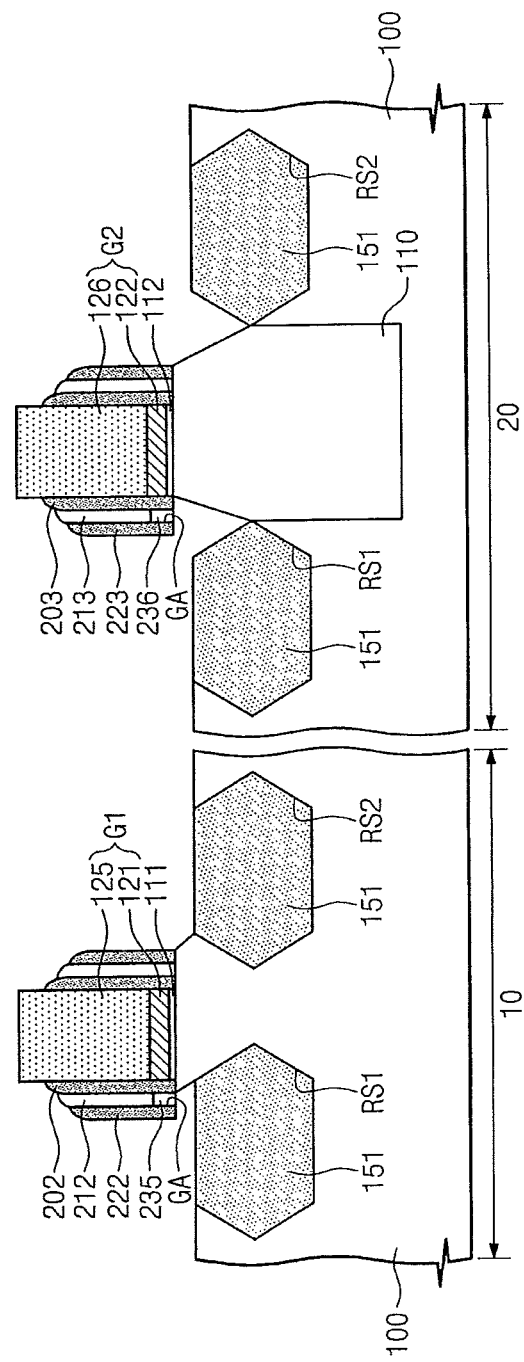
Figure 10B:
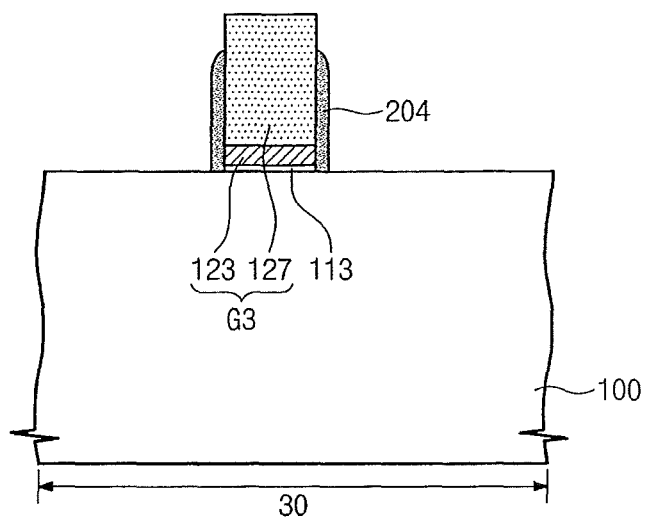

Referring to FIGS. 7B, 8A and 8B, an anisotropic dry etching process may be performed on the protecting insulating layer 231 to form protective spacers 232, 233, and 234. Portions 238 and 239 (hereinafter, referred to as "residual portions") of the protecting insulating layer 231 may remain on the second spacers 212 and 213, respectively. The protective spacer 232 adjacent to the gap region GA in the first region 10 may be in contact with top surface of the compressive stress pattern 151 and may extend into the gap region GA. A bottom surface of the protective spacer 233 adjacent to the gap region GA in the second region 20 may be spaced apart from the compressive stress pattern 151 and the device isolation layer 110 and may extend into the gap region GA. The protecting spacers 234 in the third region 30 may be formed on the masking insulating layer 224. The inventive concept is not limited to the aforementioned shapes of the protective spacers 232, 233, and 234; the shapes of the protective spacers 232, 233, and 234 may be variously modified according to a recipe of the etching process and/or shapes of layers adjacent thereto.

After the protective spacers 232, 233, and 234 are formed, a thermal treating process and/or a plasma treating process may be performed. For example, the thermal treating process may be performed at a temperature of about 500 degrees Celsius or more.

Referring to FIGS. 8A, 8B, 8C, 9A, 9B, and 9C, the upper capping patterns 135, 136, and 137 may be selectively removed—for example, by application of phosphoric acid ($H_3PO_4$). The second spacers 212, 213, and 214, the lower capping patterns 131, 132, and 133, and the protective spacers 232 and 233 may not be etched due to their etch selectivity with respect to the upper capping patterns 135, 136, and 137. On the other hand, upper portions of the first spacers 202, 203, and 204 and the third spacers 222 and 223 may be etched during the removal of the upper capping patterns 135, 136, and 137. The masking insulating layer 224 in the third region 30 may be removed along with the upper capping patterns 135, 136, and 137. Thus, the protective spacers 234 on the masking insulating layer 224 in the third region 30 may also be removed.

The protective spacers 232 and 233 may prevent the first spacers 202 and 203 from being removed in the etching process that removes the upper capping patterns 135, 136, and 137. In other words, the protective spacers 232 and 233 may prevent the first spacers 202 and 203 exposed by the gap regions GA from being partially or fully removed. If the protective spacers 232 and 233 are not present, the first spacers 202 and 203 may be damaged, thereby exposing sidewalls of the lower gate electrodes 121 and 122; and then the exposed lower gate electrodes 121 and 122 may be partially or fully removed or damaged by a subsequent etching process. Thus, reliability of a semiconductor device may be deteriorated; and non-uniformity of threshold voltages of transistors may be caused. However, according to some embodiments of the inventive concept, the first spacers 202 and 203 may be protected by the protective spacers 232 and 233. As a result, reliability of the semiconductor device may be improved, and non-uniformity of the threshold voltages of the transistors may be prevented or reduced.

Referring to FIGS. 9A, 9B, 10A and 10B, the lower capping patterns 131, 132, and 133 may be removed. When the lower capping patterns 131, 132, and 133 are removed, the protective spacers 232 and 233 of the first and second regions 10 and 20 may be partially etched to form protecting patterns 235 and 236. Upper portions of the second spacers 212 and 213 and the residual portions 238 and 239 in the first and second regions 10 and 20 may also be removed during the removal of the lower capping patterns 131, 132, and 133. On the other hand, the second spacers 214 of the third region 30 differ from the second spacers 212 and 213 of the first and second regions 10 and 20 in that they are not covered by the third spacers 222 and 223. Thus, the second spacers 214 of the third regions 30 may be completely removed when the lower capping patterns 131, 132, and 133 are removed. In some embodiments, the process of removing the lower capping patterns 131, 132, and 133 may be performed using an etching material including diluted HF (DHF) acid.

Figure 11A:
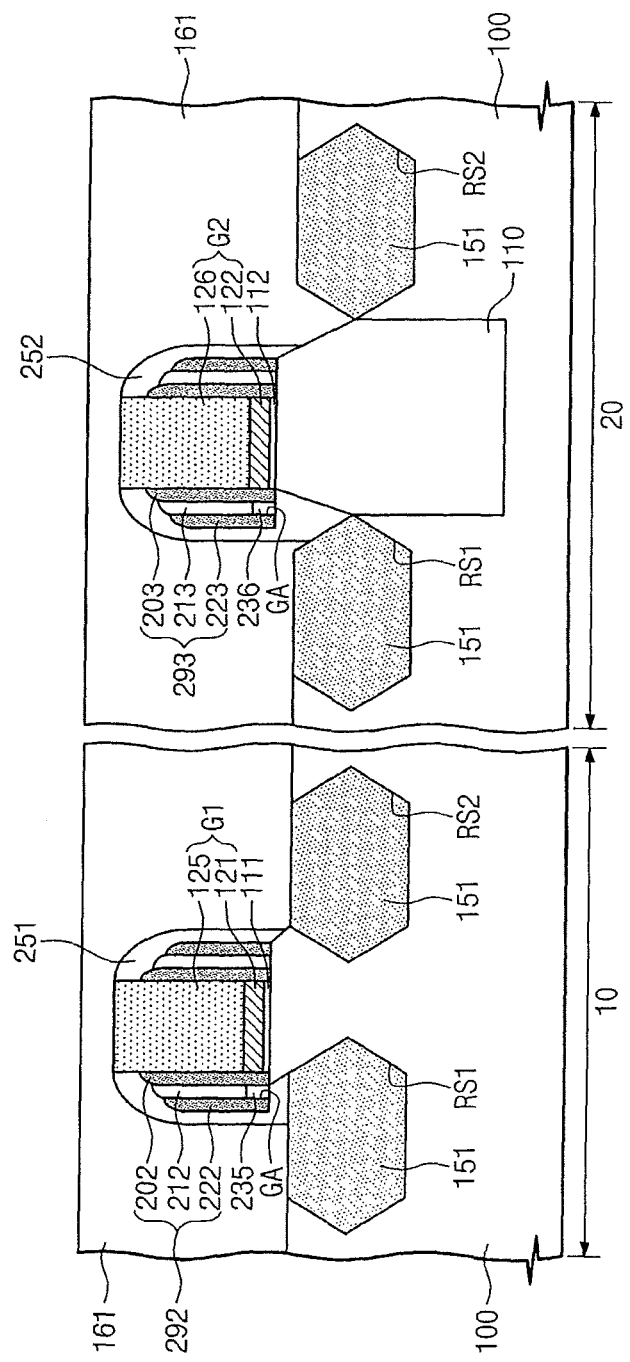
Figure 11B:
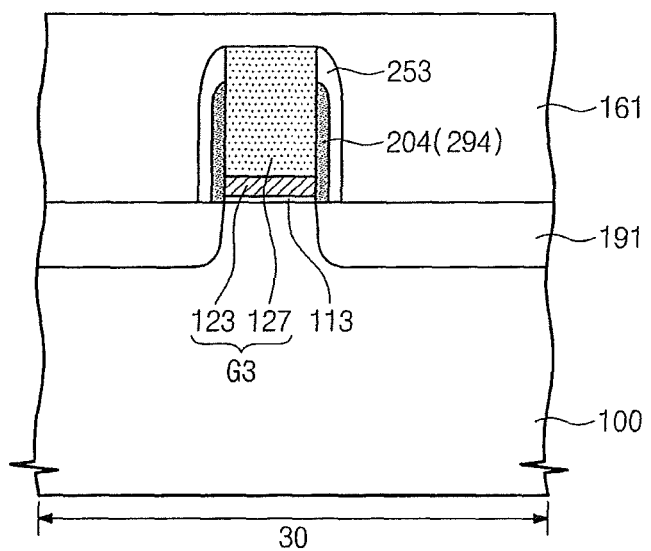

Referring to FIGS. 11A and 11B, outer spacers 251, 252, and 253 may be formed on sidewalls of the first, second, and third gate electrode patterns G1, G2, and G3, respectively. The spacers and the protecting patterns 235 and 236 between the outer spacers 251, 252, and 253 and the sidewalls of the first to third gate electrode patterns G1, G2, and G3 may be defined as inner spacers 292, 293, and 294. For example, the outer spacers 251, 252, and 253 may be formed of at least one of a silicon oxide, silicon nitride, or silicon oxynitride. An interlayer insulating layer 161 may be formed to cover the substrate 100. The interlayer insulating layer 161 may be formed of at least one of a silicon oxide, silicon nitride, or silicon oxynitride. The outer spacers 251, 252, and 253 and the interlayer insulating layer 161 may be formed using CVD processes.

Before the interlayer insulating layer 161 is formed, source/drain regions 191 may be formed in the substrate 100 of the third region 30. The source/drain regions 191 may be formed by an ion implantation process using the outer spacers 253 and the third gate electrode pattern G3 as an ion implantation mask. The source/drain region 191 may be doped regions having a conductivity type different from the conductivity type of the substrate 100 in the third region 30. In some embodiments, the source/drain regions 191 may be doped with N-type dopants. When the source/drain regions 191 are formed, the substrate 100 of the first and second regions 10 and 20 may be covered by a mask layer (not illustrated). Thus, the ion implantation process for the formation of the source/drain regions 191 may not be performed in the substrate 100 of the first and second regions 10 and 20.

According to some embodiments of the inventive concept, the inner spacers 292, 293, and 294 and the outer spacers 251, 252, and 253 may be sequentially provided on the sidewalls of the first to third gate electrode patterns G1, G2, and G3, respectively. The second gate electrode pattern G2 of the second region 20 may be provided on the device isolation layer 110.

In the first and second regions 10 and 20, the compressive stress patterns 151 are provided in the substrate 100 adjacent to the first and second gate electrode patterns G1 and G2. Top surfaces of the compressive stress patterns 151 may be lower than bottom surfaces of the first and second gate dielectric patterns 111 and 112 in the illustrated orientations. A top surface of each of the inner spacers 292 and 293 (particularly, a top surface of each of the first spacers 202 and 203) may be higher than half of the height of each of the first and second gate electrode patterns G1 and G2 and may be lower than a top surface of each of the first and second gate electrode patterns G1 and G2. As described, herein, the "top" surfaces of these components are those that are most remote from the substrate on which they are mounted, while the "bottom" surfaces of these components are those that are most proximate to the substrate. In the first and second regions 10 and 20, the outer spacers 251 and 252 may extend between the inner spacers 292 and 293 and the compressive stress patterns 151.

The inner spacers 292 and 293 may include the first spacers 202 and 203, the second spacers 212 and 213, and the third spacers 222 and 223 sequentially formed on the sidewalls of the first and second gate electrode patterns G1 and G2, respectively. Additionally, the inner spacers 292 and 293 may further include the protecting patterns 235 and 236 filling the gap regions GA defined by sidewalls of the first spacers 202 and 203, the sidewalls of the third spacers 222 and 223, and bottom surfaces of the second spacers 212 and 213, respectively. The second spacers 212 and 213 and the protecting patterns 235 and 236 may include a material having an etch selectivity with respect to the first spacers 202 and 203 and the third spacers 222 and 223. The inner spacers 292 and 293 may be vertically overlapped with the compressive stress patterns 151.

Figure 12A:
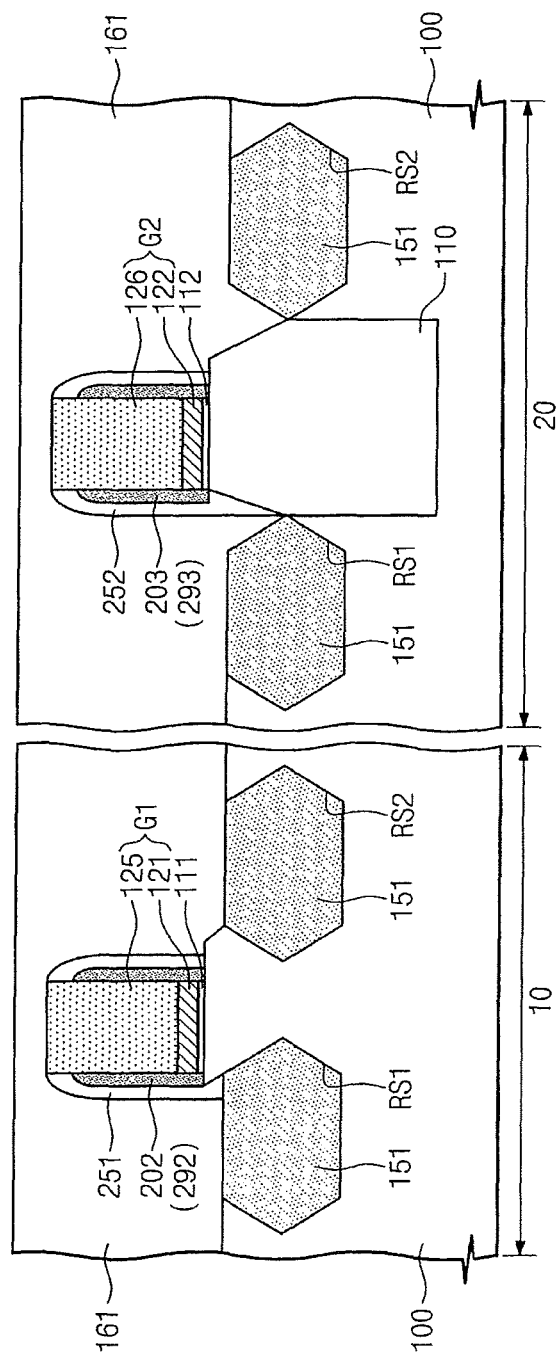
FIGS. 12A and 12B are cross-sectional views a semiconductor device and a method of forming the same according to other embodiments of the inventive concept.
Figure 12B:
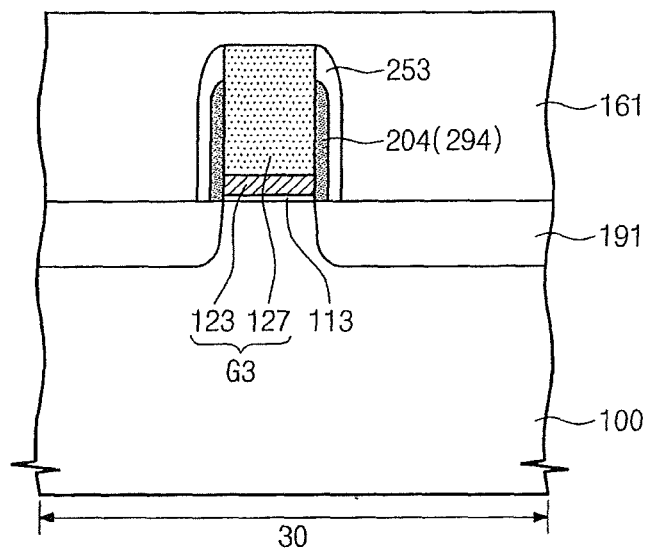

FIGS. 12A and 12B are cross-sectional views of a semiconductor device and a method of forming a semiconductor device according to other embodiments of the inventive concept. For the purpose of ease and convenience in explanation, the descriptions to the same elements as in the aforementioned embodiment will be omitted or mentioned briefly.

According to the embodiments illustrated in FIGS. 12A and 12B, inner spacers 292, 293, and 294 may includes the first spacers 202, 203, and 204. The inner spacers 292, 293, and 294, however, may not include the second spacers 212 and 213, the third spacers 222 and 223, and the protecting patterns 235 and 236. In the present embodiment, the third spacers 222 and 223 may be removed during the removal of the upper capping patterns 135, 136, and 137 described with reference to FIGS. 9A, 9B, and 9C; and the second spacers 212 and 213 and the protecting patterns 235 and 236 may be removed during the removal of the lower capping patterns 131, 132, and 133, described with reference to FIGS. 10A and 10B.

Other elements and other formation processes in the present embodiment may be the same as or similar to the elements and formation processes corresponding thereto in the aforementioned embodiments of FIGS. 1A to 11A and 1B to 11B.

Figure 13:
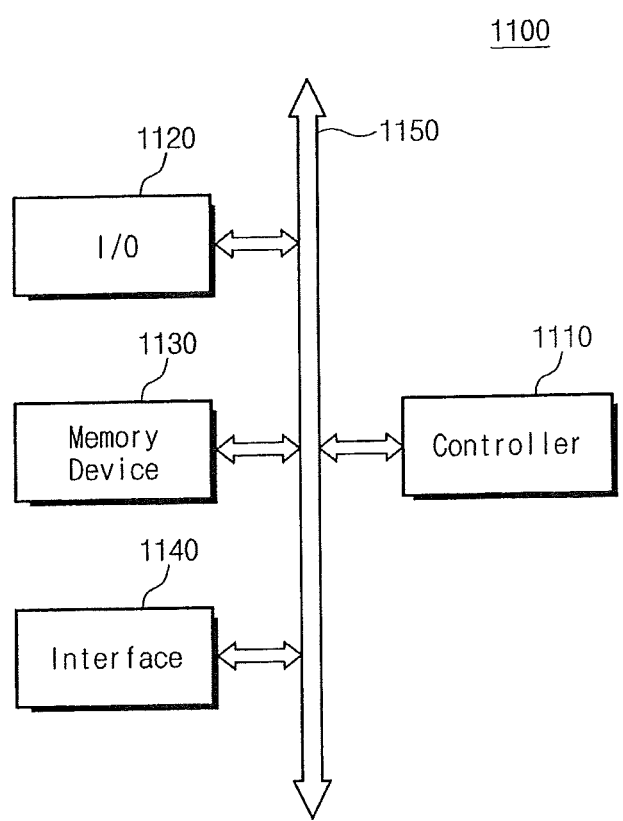
FIG. 13 is a schematic block diagram illustrating an example of electronic systems including semiconductor devices according to embodiments of the inventive concept.

FIG. 13 is a schematic block diagram illustrating an example of electronic systems including semiconductor devices according to embodiments of the inventive concept.

Referring to FIG. 13, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a function similar to that of any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The memory device 1130 may further include another type of semiconductor device which is different from the semiconductor devices described above. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or any of a variety of other electronic products. The other electronic products may receive or transmit information data by wireless communication.

According to embodiments of the inventive concept, the reliability of the semiconductor device may be improved. Additionally, non-uniformity of the threshold voltages of the transistors may be reduced or prevented.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a substrate;
   a gate dielectric layer on the substrate;
   a gate electrode on the gate dielectric layer, the gate electrode including at least one sidewall;
   a first spacer on the at least one sidewall of the gate electrode, a second spacer on the first spacer, and a third spacer on the second spacer; and
   a protecting insulating layer disposed between the third spacer and the substrate,
   wherein a portion of the protecting insulating layer is disposed between the first spacer and the third spacer.

2. The semiconductor device of claim 1, wherein the protecting insulating layer is disposed on the third spacer and the gate electrode.

3. The semiconductor device of claim 1, further comprising a stress pattern disposed in the substrate and adjacent to the gate electrode.

4. The semiconductor device of claim 3, wherein the protecting insulating layer is disposed on the stress pattern.

5. The semiconductor device of claim 1, wherein a top surface of the second spacer is at a height from the substrate that is greater than half of a height that the gate electrode extends from the substrate.

6. The semiconductor device of claim 1, wherein the protecting insulating layer comprises at least one of a silicon oxide and silicon nitride.

7. A semiconductor device comprising:
   a substrate;
   a gate dielectric layer on the substrate;
   a gate electrode on the gate dielectric layer, the gate electrode including at least one sidewall;
   a first spacer on the at least one sidewall of the gate electrode, a second spacer on the first spacer, and a third spacer on the second spacer;
   a gap region formed under the second spacer; and
   a protecting insulating layer filling the gap region.

8. The semiconductor device of claim 7, wherein the protecting insulating layer is disposed on the third spacer and the gate electrode.

9. The semiconductor device of claim 7, further comprising a stress pattern disposed in the substrate and adjacent to the gate electrode.

10. The semiconductor device of claim 9, wherein the protecting insulating layer is disposed on the stress pattern.

11. The semiconductor device of claim 7, wherein a top surface of the second spacer is at a height from the substrate that is greater than half of a height that the gate electrode extends from the substrate.

12. The semiconductor device of claim 7, wherein the protecting insulating layer comprises at least one of a silicon oxide and silicon nitride.

13. A semiconductor device comprising:
    a substrate;
    a gate dielectric layer on the substrate;
    a gate electrode on the gate dielectric layer, the gate electrode including at least one sidewall;
    a first spacer on the at least one sidewall of the gate electrode, a second spacer on the first spacer, and a third spacer on the second spacer;
    a gap region between the first spacer and the third spacer; and
    a stress pattern in the substrate adjacent to the gate electrode.

14. The semiconductor device of claim 13, further comprising a protecting pattern filling the gap region.

15. The semiconductor device of claim 14, wherein the protecting pattern comprises at least one of a silicon oxide and silicon nitride.

16. The semiconductor device of claim 13, wherein a top surface of the second spacer is at a height from the substrate that is greater than half of a height that the gate electrode extends from the substrate.

17. The semiconductor device of claim 1, wherein the third spacer comprises a first insulating material, and the protecting insulating layer comprises a second insulating material different from the first insulating material.

18. The semiconductor device of claim 17, wherein the second spacer comprises a third insulating material different from the first insulating material.

19. The semiconductor device of claim 18, wherein the first spacer comprises the first insulating material.

20. The semiconductor device of claim 1, wherein the protecting insulating layer is between the second spacer and the substrate.

21. A semiconductor device comprising:
    a substrate;
    a gate dielectric layer on the substrate;
    a gate electrode on the gate dielectric layer, the gate electrode including at least one sidewall;
    a first spacer on the at least one sidewall of the gate electrode, a second spacer on the first spacer, and a third spacer on the second spacer; and
    a protecting insulating layer disposed between the third spacer and the substrate, the protecting insulating layer directly contacting a bottom surface of the third spacer.

22. The semiconductor device of claim 21, wherein the third spacer comprises a first insulating material, and the protecting insulating layer comprises a second insulating material different from the first insulating material.

23. The semiconductor device of claim 21, wherein the protecting insulating layer is disposed on the third spacer and the gate electrode.

24. The semiconductor device of claim 21, further comprising a stress pattern disposed in the substrate and adjacent to the gate electrode.

25. The semiconductor device of claim 21, wherein the protecting insulating layer is between the second spacer and the substrate.

26. The semiconductor device of claim 21, wherein a portion of the protecting insulating layer is disposed between the first spacer and the third spacer.

* * * * *